(12) United States Patent
Hagg et al.

(10) Patent No.: US 12,292,690 B2
(45) Date of Patent: May 6, 2025

(54) INSERT FOR A SOURCE CHAMBER OF AN EUV RADIATION SOURCE

(71) Applicant: Carl Zeiss SMT GmbH, Oberkochen (DE)

(72) Inventors: Michael Hagg, Essingen (DE); Juan Jose Hasbun Wood, Bruckmühl (DE); Iris Pilch, Aalen (DE); Christof Metzmacher, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 489 days.

(21) Appl. No.: 17/864,939

(22) Filed: Jul. 14, 2022

(65) Prior Publication Data
US 2023/0019744 A1 Jan. 19, 2023

(30) Foreign Application Priority Data
Jul. 15, 2021 (DE) .......................... 102021207565.7

(51) Int. Cl.
*G03F 7/00* (2006.01)

(52) U.S. Cl.
CPC .............................. *G03F 7/70033* (2013.01)

(58) Field of Classification Search
CPC .................................................. G03F 7/70033
See application file for complete search history.

(56) References Cited

U.S. PATENT DOCUMENTS

2007/0210717 A1 9/2007 Smith et al.

OTHER PUBLICATIONS

The Examination Report issued by the German Patent Office for Application No. DE 10 2021 207 565.7 dated Apr. 27, 2022 (with English Translation).

*Primary Examiner* — Nicole M Ippolito
*Assistant Examiner* — Hanway Chang
(74) *Attorney, Agent, or Firm* — Fish & Richardson P.C.

(57) ABSTRACT

An insert for a source chamber of an EUV radiation source has a pressure stage and, spaced apart from it, a stop.

20 Claims, 4 Drawing Sheets

INSERT FOR A SOURCE CHAMBER OF AN EUV RADIATION SOURCE

CROSS-REFERENCE TO RELATED APPLICATIONS

The present patent application claims priority to German patent application DE 10 2021 207 565.7, filed on Jul. 15, 2021, the content of which is incorporated herein by reference in its entirety.

TECHNICAL FIELD

The invention relates to an insert for a source chamber of an EUV radiation source. Moreover, the invention relates to an EUV radiation source having a corresponding insert. Finally, the invention relates to an EUV radiation source module.

BACKGROUND

Radiation sources for producing EUV radiation are known from the prior art. These radiation sources typically have a source chamber in which a plasma is produced. An exit opening (aperture) for radiation is provided in the source chamber. Deposits may occur in the region of the exit opening, which result in an impairment of the beam exiting the radiation source and must therefore be removed.

SUMMARY

It is an aspect of the invention to improve an EUV radiation source. It is in particular an aspect of the invention to improve an insert for an EUV radiation source.

These aspects are achieved by an insert according to the present invention and by a radiation source having a corresponding insert.

One aspect of the invention is to design the insert such that different functions of the insert, in particular spatial separation of two regions for producing a pressure difference and an outer delimitation of a beam passage region, are separated from one another. It has been found in particular that it may be advantageous if different functions of the insert are produced by different constituent parts thereof.

The constituent parts do not need to be structurally separate component parts However, this is likewise possible. Generally, the following text will refer to different regions of the insert. The term "region" should here not be understood to be exclusively geometric, but rather as it relates to an object. It substantially has the same meaning as the term "constituent part" but leaves open the possibility that two different regions are formed on a single component part, in particular a single-piece structural element.

In particular, it has been found that it may be advantageous to spatially separate the functions of mechanically separating the source chambers to produce/maintain a pressure difference between them and the stop effect of the insert.

Owing to the fact that the first region, which serves for producing a specified minimum process pressure difference between two partial chambers of the EUV radiation source, is arranged with an offset in the beam exit direction with respect to the region acting as an aperture stop, it is possible to form the first region in a manner such that it has a specified minimum distance from a smallest outer envelope around the maximum possible beam geometry defined by the aperture stop.

This leads to the advantage that contamination, in particular deposition of debris in the first region, does not lead to a limitation of the optically used beam cone. The first region consequently has a sacrificial region, in which deposition of debris can take place, without the optically used beam cone being limited.

According to one aspect of the invention, the second region serving as the aperture stop is arranged with an offset in the beam exit direction with respect to the first region. This reduces the probability that debris is deposited in the second region that serves as the aperture stop.

According to one aspect of the invention, the insert is insertable in a source chamber wall in a reversible, in particular interchangeable, manner. It can thus form a wear part.

The indication according to which the EUV radiation source has partial chambers should not be understood to be limiting. Generally, this is understood to mean that the radiation source has an inner region and a further region that in particular adjoins it, between which regions a process pressure difference prevails during operation of the radiation source.

The aperture stop serves for producing a specified beam geometry of the illumination radiation exiting the radiation source. In particular, a beam diameter and/or a beam opening angle can be specified with the aid of the aperture stop. These variables depend not only on the geometric details of the aperture stop, but also on its distance from the EUV-producing plasma and the dimensions of the plasma region.

The maximum possible beam geometry is defined in particular by the smallest free diameter of the second region. The smallest free diameter of the second region defines, together with a distance from the plasma region of the radiation source, a maximum possible opening angle of the beam exiting the radiation source. The maximum opening angle can in particular be at most 10°, in particular at most 5°.

According to one aspect that is advantageous independently of further details of the invention, the first region is formed in particular such that, with a specified maximum opening angle of the beam exiting the radiation source, it has a specified minimum distance from the envelope of said beam. In particular, the minimum distance can be at least 0.3 mm, in particular at least 0.5 mm, in particular at least 0.7 mm, in particular at least 1 mm, in particular at least 1.5 mm and in particular at least 2 mm. It is in particular at most 3 mm, in particular at most 2 mm, in particular at most 1.5 mm and in particular at most 1 mm.

A greater distance results in a greater insensitivity to contamination. A smaller distance makes a smaller free diameter of the first region and thus better mechanical separation of the adjoining partial chambers possible.

The envelope of the exiting beam is typically conical. It is defined by the geometry of the aperture stop. The aperture stop typically has a circular free passage region. However, this need not necessarily be the case. The aperture stop can also have a non-circular elliptical or a polygonal cross section.

According to one aspect of the invention, a beam passage channel of the insert, which is delimited by the inner surface of the regions, has a free diameter that changes in the beam exit direction, and in particular expands in the beam exit direction. The beam passage channel has, in particular in the first region, a first smallest free diameter $d_1$ and, in the second region, a second smallest free diameter $d_2$, wherein the first smallest free diameter $d_1$ is smaller than the second smallest diameter $d_2$: $d_1 < d_2$.

This can make a mechanical separation of the partial chambers for producing/maintaining a process pressure difference easier.

During the operation of the radiation source, a process pressure prevailing in the inner chamber, which is also referred to as the upper chamber, can lie in the range from 50 mTorr to 150 mTorr. In the outer partial chamber, which is also referred to as the lower chamber, a high vacuum is produced.

In particular $d1:d2 \leq 0.9$, in particular $d1:d2<0.8$, in particular $d1:d2<0.75$.

In the first region, the beam passage channel can have in particular a first smallest free diameter D1 of at most 8 mm, in particular at most 7 mm, in particular at most 6 mm, in particular at most 5 mm.

The region having the first smallest diameter d1 can have a distance 1 in the beam exit direction from the region with the second smallest diameter d2 of at least 30 mm, in particular at least 40 mm, in particular at least 50 mm, in particular at least 60 mm. The distance can be in particular at most 300 mm, in particular at most 200 mm, in particular at most 100 mm. A greater distance makes possible a smaller free opening in the first region and thus better pressure separation between the partial chambers. A smaller distance results in a more compact construction of the insert.

The distance 1 between the regions with the first smallest free diameter d1 and the second smallest free diameter d2 can in particular substantially correspond to the distance LQ between the region with the first smallest free diameter d1 and the plasma region of the radiation source. Further, the following, in particular, may apply: $0.5 \leq 1:LQ \leq 2$. The exact details can depend on the configuration of the source chamber of the radiation source.

According to one aspect of the invention, the first region has in the beam exit direction an extent of at least 10 mm, in particular at least 15 mm, in particular at least 20 mm, in particular at least 30 mm, in particular at least 50 mm.

The first region has in particular an inner surface area surrounding the beam passage channel of at least 150 mm$^2$, in particular at least 200 mm$^2$, in particular at least 300 mm$^2$, in particular at least 500 mm$^2$, in particular at least 1000 mm$^2$.

A large surface of this inner surface which serves as a sacrificial region, on which debris deposition can occur without the optically used beam cone being limited leads to a longer lifetime of the radiation source.

According to one aspect of the invention, the first region and the second region can be formed by separate constituent parts. This aspect is also advantageous independently of the remaining details of the invention. In particular, the insert can be formed in multiple parts, in particular two parts or three parts.

In particular, the insert can have a constituent part serving as a pressure stage and a constituent part serving as an aperture stop, which are formed in particular as separate constituent parts.

A third region can be arranged in the beam exit direction between the first region and the second region. In general, the first region and the second region, in particular the pressure stage and the stop, can be spatially separated from one another, in particular spaced apart.

The third region which is in the form of a separate constituent part can ensure a specified positioning of the second region, which serves as aperture stop, in relation to the first region, which serves as pressure stage.

According to one aspect of the invention, inlet openings for letting gas into the beam passage channel can be arranged in the third region. The inlet openings are distributed in particular over the third region on the circumferential side. They can be distributed in particular equidistantly over the circumference of the third region. This may also be a substantially annular inlet opening. This aspect is likewise advantageous independently of further details of the invention.

Gas can be guided into the beam passage channel with the aid of the inlet openings. This can further reduce the probability of debris being deposited at the stop, in particular at the second region of the insert.

According to one further aspect of the invention, which can likewise be advantageous independently of the remaining details of the invention, the insert is made, at least regionally, from sintered silicon carbide and/or from molybdenum.

In particular the first and/or second constituent part, i.e. the constituent part serving as pressure stage and/or the constituent part serving as aperture stop can be produced from sintered silicon carbide and/or from molybdenum, in particular from one of these materials. These constituent parts are in particular made from a material that is resistant to chipping due to the plasma burning in the source chamber.

The first region and the second region can be made in particular from the same material. The third region, arranged between the first region and the second region, can be made from a different material than the first and/or second region.

The third region can be made in particular from aluminium or an aluminium compound. This makes production easier.

According to one further aspect, all the constituent parts of the insert are able to be assembled with an accurate fit. Adjoining constituent parts can in particular each have protrusions and cutouts, respectively, that are matched to one another.

According to one further aspect of the invention, which is likewise advantageous independently of the remaining details of the invention, the insert can have a collar-type protrusion surrounding the beam passage channel at least partially circumferentially.

The collar-type protrusion is disposed on the side of the insert facing the plasma region, in particular on a side of the first region opposite the second region of the insert in the beam exit direction. The collar-type protrusion can be formed in particular in one part with the pressure stage. In particular, it can be disposed at a free end of the first region.

The collar-type protrusion can circumferentially surround the beam passage channel over a circumferential angle of at least 90°, in particular at least 120°, in particular at least 180°. It can surround the beam passage channel in particular completely.

A corresponding collar-type protrusion can prevent debris, in particular loose flakes, from entering the beam passage channel. It is possible in particular to reduce the risk of debris penetrating the beam passage channel through a corresponding collar-type protrusion.

The collar-type protrusion can have a conically tapering outer surface.

Its greatest outer diameter can in particular be smaller than the outer diameter of the part of the first region adjoining it in the beam exit direction. This allows material to be saved.

Preferably, all edges, in particular all transitions, are rounded.

Hence, an accumulation of debris in these regions can be prevented.

The outer surface of the collar-type protrusion can be in particular polished. It can in particular have a roughness having an average roughness value $R_a$ of at most 1 μm. The deposition of debris on the outer side of the collar is reduced in this way.

According to one further aspect of the invention, the first region having the sacrificial region has a main body with a substantially circular-cylindrical outer surface. The latter is concentrically adjoined in the beam exit direction by a likewise circular-cylindrical contact surface, which has a greater diameter. The difference between the outer diameters lies in the range from 50 μm to 1 mm. In particular, it is at least 100 μm, in particular at least 200 μm. Preferably, it is at most 500 μm, in particular at most 300 μm. With the contact surface, it is possible to ensure exact positioning of the insert in the source chamber wall. Owing to the region of the insert that is set back towards the inside with respect to the contact surface, in particular owing to the reduced outer diameter of the region adjoining the contact surface counter to the beam exit opening, the insertion of the insert into the source chamber wall can be made easier.

Rather than circular-cylindrical outer surfaces, the contact surface and/or the outer surface of the insert adjoining it counter to the beam exit direction can also have a slightly conical outer surface.

The contact surface has an extent parallel to the beam exit direction of at most 1 cm, in particular at most 5 mm, in particular at most 3 mm, in particular at most 2 mm. A contact shoulder can adjoin the contact surface in the beam exit direction. Holes for receiving fastening means, in particular screws, can be provided in said contact shoulder.

The precise guidance, in particular positioning, of the pressure stage within the source chamber is achieved by the contact surface and the adjoining contact shoulder. In the region that adjoins it counter to the beam exit direction, between the insert and the source chamber wall or the carrier in which the insert is placed, a tolerance gap remains. This aspect is also advantageous independently of further details of the invention.

An EUV radiation source according to the invention has a first source chamber and a second source chamber, which are separated from one another by a chamber wall, wherein an insert according to the preceding description is arranged in the chamber wall.

The insert is reversibly interchangeable.

The insert is insertable into a cutout provided therefor with a precise fit. The insert rests in particular by the contact surface on the circumference side against the cutout provided therefor.

The advantages of the radiation source are evident from those of the insert.

An EUV radiation source module according to the invention has an EUV radiation source according to the preceding description and a housing that adjoins a beam exit opening and is able to be closed with respect to the outside in a vacuum-tight manner The advantages are likewise evident from those of the insert.

BRIEF DESCRIPTION OF DRAWINGS

Further details and advantages of the invention will become apparent from the description of exemplary embodiments with reference to the figures, in which.

DETAILED DESCRIPTION

Figure 1:
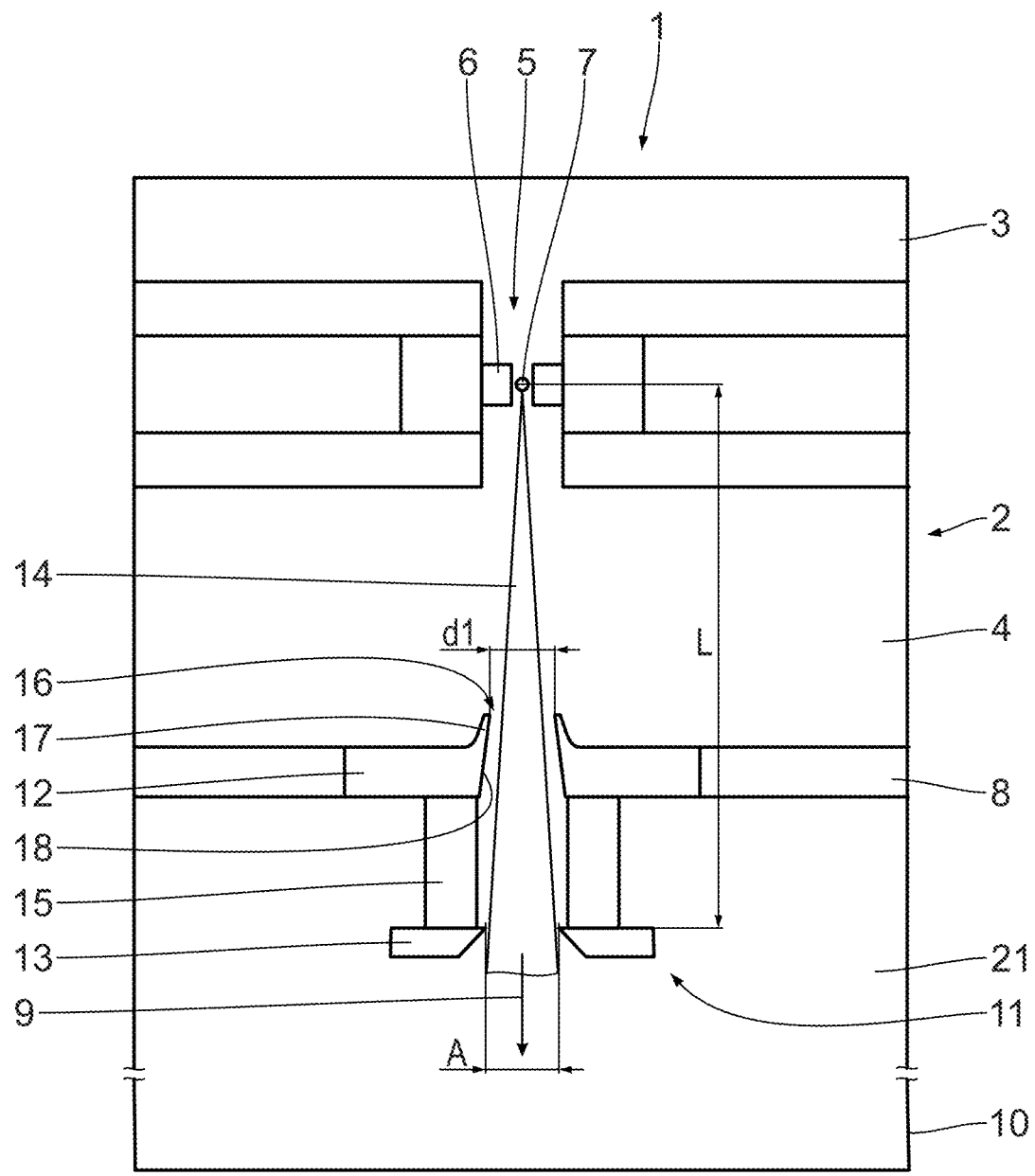
FIG. 1 schematically shows a cross section through an EUV radiation source having a plurality of source chambers and an insert inserted into a chamber wall, FIG. 2 schematically illustrates a cross section through an insert for an EUV radiation source.
Figure 2:
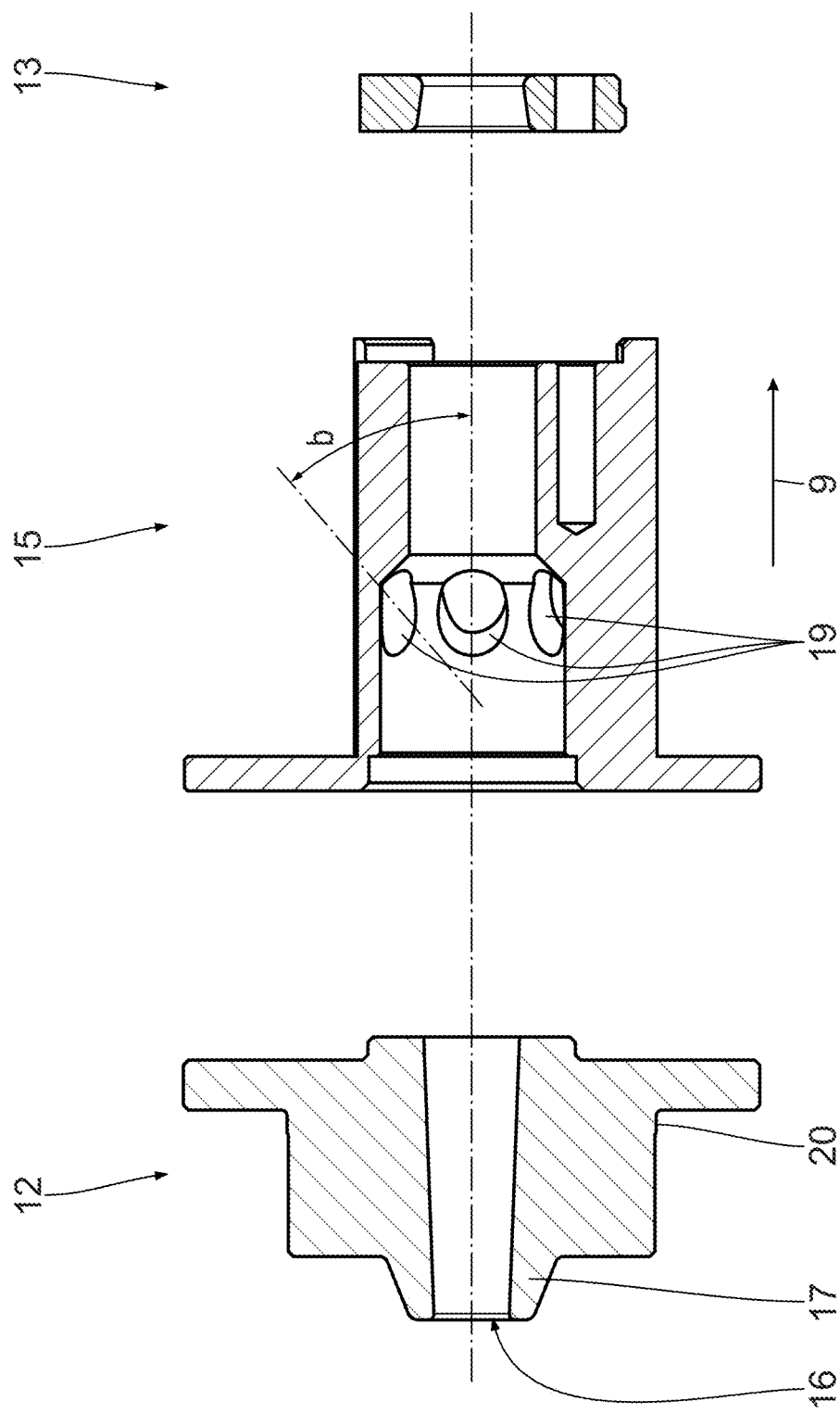
Figure 3:
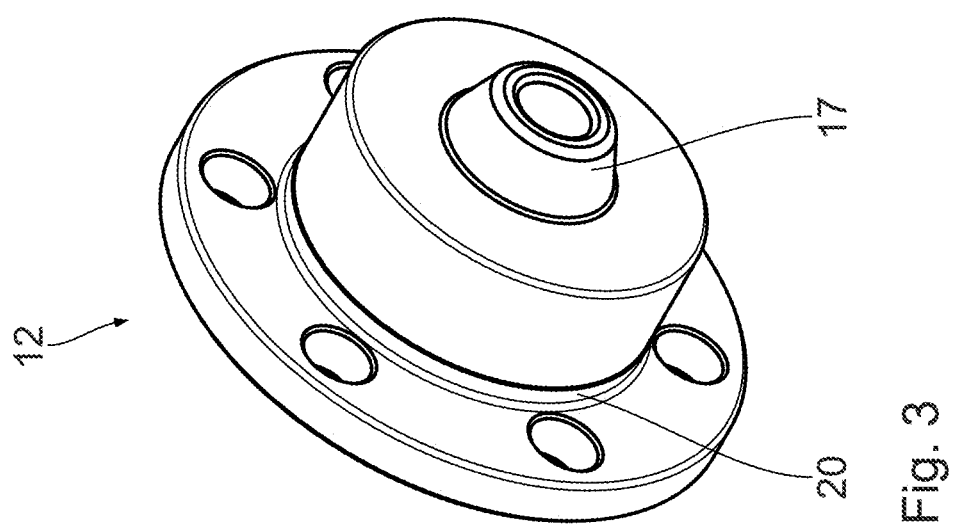
FIG. 3 shows a perspective view of a first constituent part of the insert according to FIG. 2, which serves as pressure stage.
Figure 5:
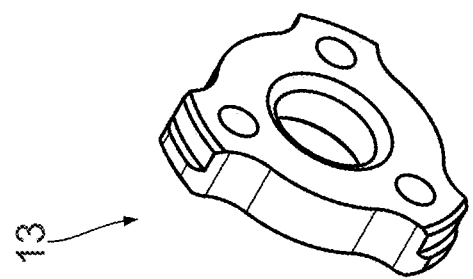
FIG. 5 shows a perspective view of a second constituent part of an insert according to FIG. 2, which serves as aperture stop.
Figure 4:
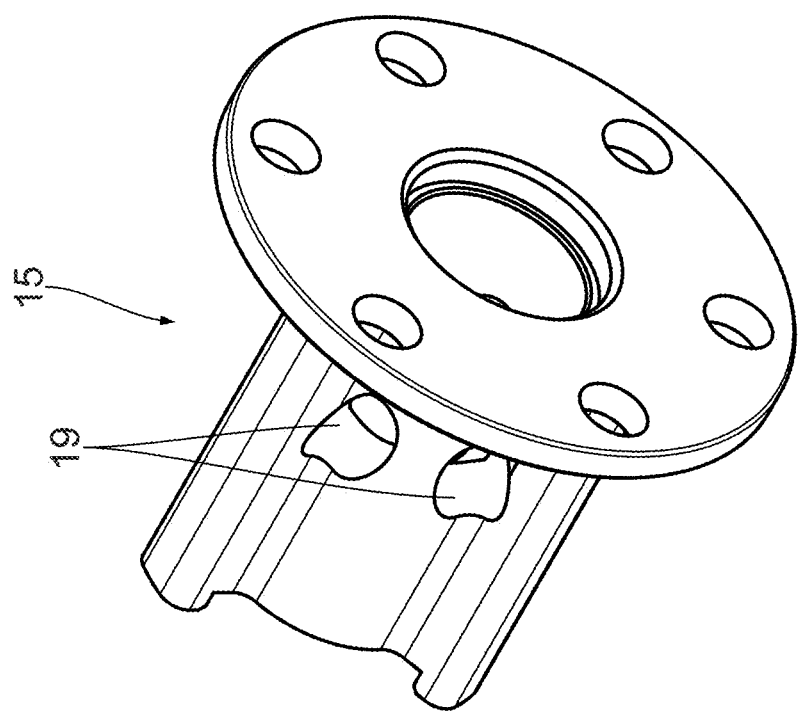
FIG. 4 shows a perspective view of a connecting piece of an insert according to FIG. 2.

FIG. 1 shows a schematic illustration of an EUV radiation source 1. The EUV radiation source 1 can be part of an illumination system (not illustrated explicitly) of a projection exposure apparatus.

The EUV radiation source 1 has a two-part source chamber 2. The source chamber 2 has an upper chamber part 3 and a lower chamber part 4.

The upper chamber part 3 is connected to the lower chamber part 4 by a central opening 5. An insert 6, which is also referred to as "bore", is located in the central opening 5, which is also referred to as passage channel. The insert 6 circumferentially surrounds a plasma production region 7 that is likewise marked in the figure.

During the operation of the EUV radiation source 1, a plasma is produced in the plasma production region 7. A beam 14 with EUV radiation propagates starting from the plasma production region 7 during the operation of the EUV radiation source 1. The beam 14 leaves the source chamber 2 in a beam cone disposed around the beam exit direction 9.

The plasma production region 7 has a diameter that is smaller than the distance between the chamber wall 8 and the plasma production region 7 by several orders of magnitude. The plasma production region 7 can therefore in a first approximation be considered to be in the shape of a point.

During the operation of the EUV radiation source 1, the upper chamber part 3 and the lower chamber part 4 can be filled with xenon. A xenon partial pressure in a range from 50 mTorr to 150 mTorr can prevail in the upper chamber part 3 and in the lower chamber part 4 during the operation of the EUV radiation source 1.

The EUV radiation source 1 has a chamber wall 8. The chamber wall 8 is arranged at a distance from the plasma production region 7 in a beam exit direction 9. The distance between the chamber wall 8 and the plasma production region 7 lies in the range from 50 mm to 80 mm.

The EUV radiation source 1 has a housing 10 that is able to be closed with respect to the outside in a vacuum-tight manner.

The insert 11 surrounds a beam passage channel 16 on the circumferential side. The region of the EUV radiation source 1 that adjoins the beam passage channel 16 towards the outside and is disposed within the housing 10 thereof can form a service chamber 21.

An insert 11 is inserted into the chamber wall 8. The insert 11 will be described in more detail below.

During the operation of the EUV radiation source 1, a high vacuum is produced in the housing 10 outside the source chamber 2.

The insert 11 is inserted into the chamber wall 8 reversibly, in particular interchangeably. The insert has a first constituent part 12, which serves as pressure stage. The first constituent part 12 serves in particular for producing a specified process pressure difference between the source chamber 2, in particular the lower chamber part 4, and the region outside the source chamber 2 during the operation of the EUV radiation source 1.

A second constituent part 13 of the insert 11 is arranged with an offset in relation to the first constituent part 12 in the beam exit direction 9. The second constituent part 13 serves as a stop, in particular aperture stop, for delimiting the beam 14 of the EUV radiation produced by use of the EUV radiation source 1.

The stop defines a maximally possible beam geometry, in particular a maximum opening angle of the beam 14 of the EUV radiation. The opening angle is defined, for one part, by a free opening A of the second constituent part 13 and, for the other, by its distance L from the plasma production region 7. The free opening A can lie in the range from 6 mm to 10 mm. The distance L can lie in a range from 70 mm to 300 mm, in particular in the range from 90 mm to 200 mm.

A connecting piece 15 is provided between the first constituent part 12 and the second constituent part 13. The connecting piece 15 serves for accurately positioning the second constituent part 13 in relation to the first constituent part 12.

The connecting piece 15 can be produced from aluminium or an aluminium compound. In particular, it can be made from a different material than the first constituent part 12 and/or the second constituent part 13.

A collar 17, which surrounds the beam passage channel 16 on the circumferential side, is arranged on the side of the first constituent part 12 facing the plasma production region 7.

The collar 17 has a conically tapering outer surface.

The collar 17 has a smallest free diameter d1. The smallest free diameter d1 of the collar 17 lies in particular in the range from 5 mm to 8 mm.

The smallest free diameter d1 is in particular smaller than the free opening A of the second constituent part 13. In particular d1: d2≤0.9, in particular d1: d2≤0.8, in particular d1: d2≤0.75.

All transitions at the outer surface of the first constituent part 12 have a rounded design. This prevents the deposition of debris.

The first constituent part 12 and the second constituent part 13 can be made from ceramic, in particular from sintered silicon carbide or from molybdenum.

The first constituent part 12 is embodied such that its inner surface 18 is spaced apart from the beam 14. In particular, the inner surface 18 has a minimum distance from the beam 14, in particular at least 0.3 mm, in particular at least 0.5 mm, in particular at least 0.7 mm, in particular at least 1 mm.

The connecting piece 15 preferably also has an inner surface that is spaced apart from the beam 14.

Holes 19 are arranged in the connecting piece 15. Gas can be introduced into the beam passage channel 16 through the holes 19. The probability of debris deposition at the stop can be reduced on account of the introduced gas.

The holes 19 are arranged in the connecting piece 15 at an angle b with respect to the beam exit direction 9. The angle b lies in the range from 10° to 60°, in particular 30° to 50°. It can be 45°.

The first constituent part 12 is arrangeable with a precise fit in a cutout provided therefor in the chamber wall 8. In particular, it can be fastened, in particular screw-connected, to the chamber wall 8.

The first constituent part 12 has a contact surface 20. It rests in particular by the contact surface 20 against the chamber wall 8. Counter to the beam exit direction 9, a region that is set back adjoins the contact surface 20. This makes the insertion of the first constituent part 12 into the chamber wall 8 easier.

Guiding and positioning the first constituent part 12 in the chamber wall 8 is not realized over the entire height of the first constituent part, but merely over the contact surface 20. In the region adjoining the contact surface 20 counter to the beam exit direction 9, a tolerance gap remains between the chamber wall 8 and the first constituent part 12 for the insert 11 that has been inserted into the chamber 8.

The connecting piece 15 is reliably connectable to the first constituent part 12. For example, it can be screw-connected to the first constituent part 12. The same screws that serve for the connection of the first constituent part 12 to the chamber wall 8 can be used herefor.

The second constituent part 13 of the insert 11 is reliably connectable, in particular by screws, to the connecting piece 15.

The first constituent part 12, the connecting piece 15 and the second constituent part 13 are able to be assembled in particular with an accurate fit.

In deviation from the embodiment illustrated in the figures, in which the insert 11 is formed from three pieces, the insert 11 can also be formed from two pieces or in one piece. The connecting piece can be in particular part of the first constituent part 12 and/or the second constituent part 13.

It is likewise possible to omit the collar 17. This is possible in particular if the beam exit direction 9 points counter to the force of gravity during the operation of the EUV radiation source 1, as consequently there is no reason to fear that pieces of contamination will fall into the beam passage channel 16 due to gravity.

While this specification contains many implementation details, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination. The separation of various system components in the embodiments described above should not be understood as requiring such separation in all embodiments.

Thus, particular embodiments of the invention have been described. Other embodiments are within the scope of the following claims. In addition, the actions recited in the claims can be performed in a different order and still achieve desirable results.

What is claimed is:

1. An insert for a source chamber of an EUV radiation source for producing a beam with EUV radiation, the insert comprising:
   1.1. a first region extending in a beam exit direction, and
   1.2. a second region extending in a beam exit direction,
   1.3. wherein in each case an inner surface delimits a beam passage channel on the circumferential side in the regions,
   1.4. wherein the second region serves for delimiting a maximally possible beam geometry, 1.5. wherein the first region serves for producing and/or maintaining a pressure difference on opposite sides of the insert during the operation of the EUV radiation source, 1.6. wherein the second region is arranged with an offset in relation to the first region in the beam exit direction, and 1.7. wherein the first region is embodied such that it has a specified minimum distance from a smallest outer envelope around the maximally possible beam geometry defined by the second region.

2. The insert of claim 1, wherein the beam passage channel has, in the first region, a first smallest free diameter (d1) and, in the second region, a second smallest free diameter (d2), wherein the first smallest diameter (d1) is smaller than the second smallest diameter (d2): d1<d2.

3. The insert of claim 1, wherein the beam passage channel has a first smallest free diameter (d1) of at most 8 mm in the first region.

4. The insert of claim 1, wherein the beam passage channel has, in the first region, a first smallest free diameter (d1) and, in the second region, a second smallest free diameter (d2), wherein the first smallest diameter (d1) and the second smallest diameter (d2) have a distance (1) of at least 30 mm in the beam exit direction.

5. The insert of claim 1, wherein the first region has an extent in the beam exit direction of at least 10 mm.

6. The insert of claim 1, wherein the first region and the second region are formed by separate constituent parts.

7. The insert of claim 1, wherein the first region and the second region are spaced apart from each other by a third region.

8. The insert of claim 7, wherein inlet openings for letting gas into the beam passage channel are arranged in the third region.

9. The insert of claim 1, wherein the insert is at least partially made from sintered SiC and/or from molybdenum.

10. The insert of claim 1, wherein a third region, which is made from a different material than the first region and/or the second region, is arranged between the first region and the second region.

11. The insert of claim 1, comprising a collar-type protrusion, which at least partially surrounds the beam passage channel on the circumferential side.

12. The insert of claim 1, wherein the constituent part forming the first region has an outer surface with a contact surface that has a greater diameter than an adjoining outer surface region.

13. An EUV radiation source, having
13.1. a source chamber; and
13.2. further chambers,
13.3. which are separated by a chamber wall,
13.4. wherein an insert of claim 1 is arranged in the chamber wall.

14. The EUV radiation source of claim 13, wherein the beam passage channel has, in the first region, a first smallest free diameter (d1) and, in the second region, a second smallest free diameter (d2), wherein the first smallest diameter (d1) is smaller than the second smallest diameter (d2): d1<d2.

15. The EUV radiation source of claim 13, wherein the beam passage channel has a first smallest free diameter (d1) of at most 8 mm in the first region.

16. The EUV radiation source of claim 13, wherein the beam passage channel has, in the first region, a first smallest free diameter (d1) and, in the second region, a second smallest free diameter (d2), wherein the first smallest diameter (d1) and the second smallest diameter (d2) have a distance (1) of at least 30 mm in the beam exit direction.

17. An EUV radiation source module comprising
17.1. an EUV radiation source of claim 13; and
17.2. a housing that is able to be closed with respect to the outside in a vacuum-tight manner.

18. The EUV radiation source module of claim 17, wherein the beam passage channel has, in the first region, a first smallest free diameter (d1) and, in the second region, a second smallest free diameter (d2), wherein the first smallest diameter (d1) is smaller than the second smallest diameter (d2): d1<d2.

19. The EUV radiation source module of claim 17, wherein the beam passage channel has a first smallest free diameter (d1) of at most 8 mm in the first region.

20. The EUV radiation source module of claim 17, wherein the beam passage channel has, in the first region, a first smallest free diameter (d1) and, in the second region, a second smallest free diameter (d2), wherein the first smallest diameter (d1) and the second smallest diameter (d2) have a distance (1) of at least 30 mm in the beam exit direction.

* * * * *

UNITED STATES PATENT AND TRADEMARK OFFICE
CERTIFICATE OF CORRECTION

| | | |
|---|---|---|
| PATENT NO. | : 12,292,690 B2 | Page 1 of 1 |
| APPLICATION NO. | : 17/864939 | |
| DATED | : May 6, 2025 | |
| INVENTOR(S) | : Michael Hagg et al. | |

It is certified that error appears in the above-identified patent and that said Letters Patent is hereby corrected as shown below:

In the Specification

<u>Column 3</u>
Line 10, delete "$d2 < 0.8$" and insert -- $d2 \leq 0.8$ --
Line 11, delete "$d2 < 0.75$" and insert -- $d2 \leq 0.75$ --

Signed and Sealed this
Eighth Day of July, 2025

Coke Morgan Stewart
*Acting Director of the United States Patent and Trademark Office*